(12) United States Patent
Yamagishi

(10) Patent No.: US 6,246,248 B1
(45) Date of Patent: Jun. 12, 2001

(54) TESTER FOR DETECTING AN ABNORMAL QUIESCENT POWER SUPPLY CURRENT IN A DEVICE UNDER TEST

(75) Inventor: Masaru Yamagishi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/372,384

(22) Filed: Aug. 11, 1999

(30) Foreign Application Priority Data

Aug. 31, 1998  (JP) .................................................. 10-246375

(51) Int. Cl.[7] .................................................. G01R 31/28
(52) U.S. Cl. .................................................. 324/763
(58) Field of Search .................................... 324/765, 763, 324/158.1, 73.1; 714/733; 702/64; 700/306; 326/16; 327/141, 334

(56) References Cited

U.S. PATENT DOCUMENTS 5,528,136 * 6/1996 Rogoff et al. ..................... 324/158.1
5,929,650 * 7/1999 Pappert et al. ........................ 324/763
5,949,798 * 9/1999 Sakaguchi ............................ 371/27.1

* cited by examiner

Primary Examiner—Vinh P. Nguyen
(74) Attorney, Agent, or Firm—Flynn, Thiel, Boutell & Tanis, P.C.

(57) ABSTRACT

A tester detects an abnormality in a quiescent power supply current of a device under test. In the tester, a programmable voltage generation source controls a power supply unit, providing a device under test with power. A test pattern generator applies test patterns repeatedly to the device under test. Power supply current to the device under test is converted into voltage values by a detection resistor. A spectrum analyzer unit finds a differential between voltage values occurring between opposite ends of the detection resistor, and voltage values proportional to power supply current values of a device known to perform properly, as measured beforehand. The spectrum analyzer ouputs a power of a fundamental wave of a frequency spectrum obtained by applying the EFT method to the differential. The decision unit prestores spectrum reference values Po as the maximum values for power of the fundamental wave, giving a decision that the quiescent power supply current is abnormal if the power is in excess of the spectrum reference value. The decision is sent out to a CPU, and displayed on a display unit.

15 Claims, 5 Drawing Sheets

TESTER FOR DETECTING AN ABNORMAL QUIESCENT POWER SUPPLY CURRENT IN A DEVICE UNDER TEST

BACKGROUND OF THE INVENTION

1. Field of the Invention

The present invention relates to a device tester for detecting abnormality with quiescent power supply current (referred to as IDDQ sometimes hereinafter) by giving a decision on variation in power supply current flowing through a device under test (hereinafter referred to as DUT) such as an integrated circuit and so forth.

2. Description of the Related Art

Following scaleup of integrated circuits and a resultant increase in the number of elements thereof, there has arisen necessity of giving a decision with higher precision on whether or not the integrated circuits perform properly. For this reason, in a function test conducted on, for example, an integrated circuit, it has been a general practice to check up the quiescent power supply current in the integrated circuit as useful means of detecting abnormal leak current and the like occurring thereto caused by failure thereof due to short-circuiting. FIG. 5 is a block diagram showing the configuration of a conventional device tester which has been in widespread use to perform such a test.

In FIG. 5, a DUT 1 denotes a device under test such as the integrated circuit described above and the like. A constant-voltage power supply 2 provides power supply at a predetermined voltage value to the DUT 1 via a detection resistor 3, and such power supply causes a quiescent power supply current to flow through the DUT 1. A current value of the quiescent power supply current is converted into a voltage at a voltage value proportional to the current value by the detection resistor 3. A voltage level adjustment circuit 4 either amplifies or reduces a voltage between opposite ends of the detection resistor 3 such that an output voltage thereof can fall within a range of input voltages suitable for conversion by an A/D converter 5. The A/D converter 5 converts a voltage value delivered from the voltage level adjustment circuit 4 (that is, the voltage value proportional to the current value of the quiescent power supply current) into digital data, and delivers same to a CPU 6 (central processing unit). The CPU 6 gives a decision on whether or not the quiescent power supply current of the DUT 1 is normal on the basis of the digital data delivered from the A/D converter 5 through comparison with a predetermined reference current value, and so forth. In the figure, a capacitor 7 is installed for bypassing noise and so forth.

With the conventional device tester described in the foregoing, however, there are limitations in respect of operational speed and so forth of the A/D converter 5, and in consequence, it takes as long as from several tens of milliseconds to measure one test pattern. It follows therefore that it will take several tens of minutes to give a decision on the quiescent power supply current for all test patterns amounting in number to as many as several ten thousands to several hundred thousands. For this reason, testing of the state of the quiescent power supply current is seldom employed at production lines today except the case of failure or evaluation of integrated circuits. Furthermore, for giving a decision on whether or not the quiescent power supply current is normal, the predetermined reference current value, serving as a reference in giving the decision, needs to be determined beforehand, however, there is a problem that it is difficult to accurately find the value beforehand because the power supply current value varies in actual practice widely depending on process conditions and circuit conditions of individual integrated circuits.

SUMMARY OF THE INVENTION

In light of the problems described above, the invention has been developed, and an object of the invention is to provide a device tester capable of giving a decision rapidly and with ease on abnormality with a quiescent power supply current present in a device under test.

To this end, the device tester of the invention, for deciding whether or not an abnormal quiescent power supply current is present in a device under test by providing the device under test with power supply, comprises pattern generation means for applying test patterns repeatedly to the device under test, measuring means for measuring current values of power supply current flowing through the device under test, computation means for finding a differential between the current values of the power supply current as measured and reference power supply current values of a device known to perform properly, as measured beforehand by applying the test patterns thereto, analyzing means for finding a spectrum by executing frequency analysis on the differential in power supply current value, and decision means for deciding presence of the abnormal quiescent power supply current by detecting that a power of the spectrum is in excess of a predetermined threshold value.

Further, the predetermined threshold value may be a maximum value permissible for the power of the spectrum obtained by executing the frequency analysis on the differential in power supply current value.

Furthermore, the reference power supply current value may be determined through statistical analysis of power supply current values as measured of a plurality of devices of the same kind as the device under test and identified as performing properly.

DESCRIPTION OF THE PREFERRED EMBODIMENTS

An embodiment of the invention is described hereinafter with reference to the accompanying drawings. To start with, the principle of detecting abnormal quiescent power supply current is described. In general, there could be times when a large quiescent power supply current flows through a DUT even in the case where there exists no failure therein. Accordingly, there will be cases where it is impossible to give an accurate decision if it is simply decided that a quiescent power supply current of a current value in excess of a threshold value is presumed abnormal. Therefore, it becomes necessary to distinguish abnormal quiescent power supply current from normal quiescent power supply current by other means.

For this reason, it has been put into practice to detect abnormal quiescent power supply current which should not by nature be flowing by selecting a device identified as one performing properly as a DUT used for reference (hereinafter referred to as "reference") from among devices of the same kind as the DUT previously described, measuring a power supply current value of the reference beforehand by applying test patterns thereto, and thereby finding a differential in current value between the power supply current of the reference and a power supply current actually flowing through the DUT.

In this case, it is only a specific test pattern among a multitude of test patterns that causes the abnormal quiescent power supply current to flow through the DUT. However, it is extremely difficult in practice to detect such a specific test pattern in real time. Accordingly, with the embodiment of the invention, while applying test patterns repeatedly to the DUT, a differential in current value between the power supply current of the reference as already measured and the power supply current flowing through the DUT is repeatedly found, and a spectrum analysis is executed on differentials in power supply current value to give a decision on whether or not the abnormal quiescent power supply current is present.

Figure 2:
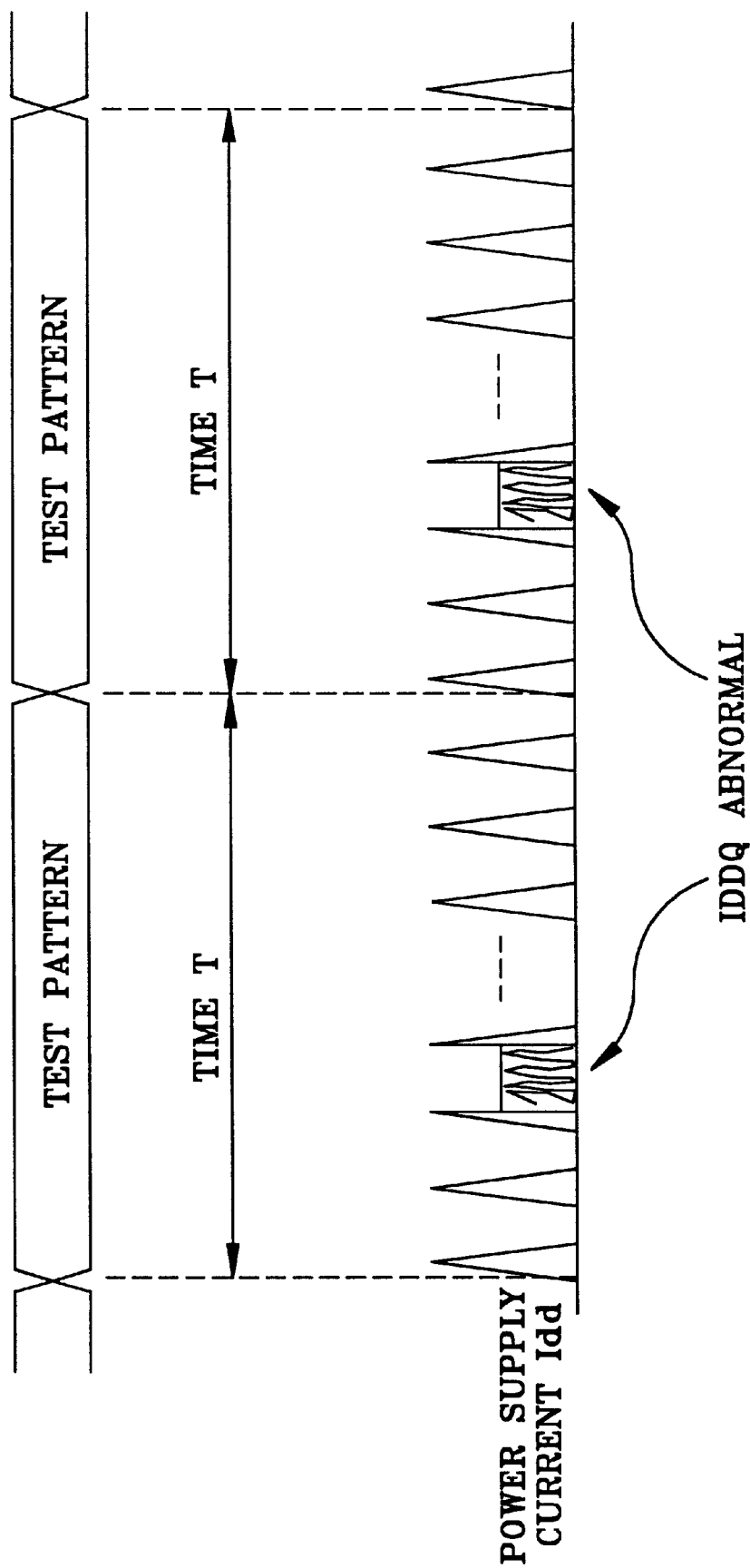
FIG. 2 is a timing chart showing waveforms of a power supply current Idd flowing through a DUT of the embodiment of the invention when test patterns are repeatedly applied to the DUT.

FIG. 2 shows an example of waveforms of a power supply current Idd flowing through the DUT when test patterns are repeatedly applied to the DUT. As shown in the figure, a series of test patterns ranging in number from several ten thousands to several hundred thousands are generated for every period of time T, and the same test patterns are applied to the DUT every T seconds. A length of the period of time T varies depending on the kind of the DUT as the object of testing, and for example, is in the order of from 1 millisecond to 10 milliseconds. In the figure, sawtooth-like projections appearing in the waveform of the power supply current Idd represent power supply currents flowing through the DUT every time respective test patterns are applied thereto, and minuscule power supply currents flowing between the adjacent sawtooth-like projections represent quiescent power supply currents.

In case of any fault occurring to an integrated circuit, an abnormal quiescent power supply current is caused to flow therethrough when the test patterns are applied thereto. The abnormal quiescent power supply current corresponds to a differential between the power supply current flowing through the reference and power supply current flowing through an abnormal DUT, and regions in the figure, denoted by "IDDQ abnormal", represent intervals during which the abnormal quiescent power supply current is flowing. Since the test patterns are applied at a cycle of T seconds as described in the foregoing, the abnormal quiescent power supply current is also caused to occur every T seconds correspondingly to the test patterns applied. As a result, a frequency spectrum obtained by executing a spectrum analysis on the abnormal quiescent power supply current will contain a fundamental wave at a frequency $f0=1/T$ (Hz) shown as "abnormal" in FIG. 3, and harmonics corresponding to the fundamental wave.

Figure 3:
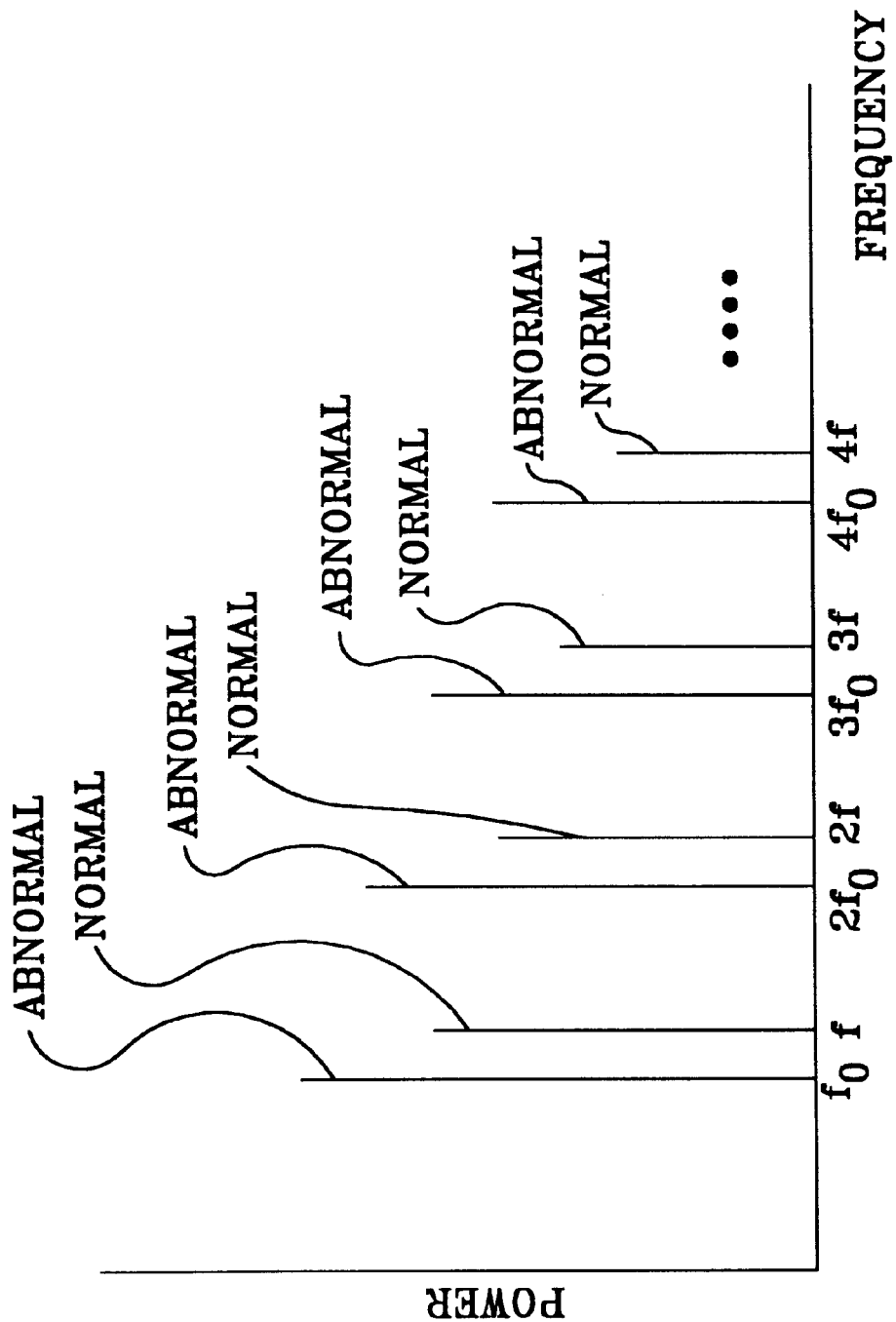
FIG. 3 is a graph showing a frequency spectrum when quiescent power supply current is normal and abnormal, respectively, obtained by executing a spectrum analysis on differentials between power supply current flowing through reference and same flowing through the DUT of the embodiment of the invention.

On the other hand, in case that the quiescent power supply current is within an allowable range and taken as normal, by executing a spectrum analysis on differentials between the power supply current flowing through the reference and power supply current flowing through a normal DUT, a frequency spectrum is obtained wherein a fundamental wave denoted as "normal" in FIG. 3, at a frequency f, with less power than that for the case of the abnormal quiescent power supply current, and harmonics corresponding to the fundamental wave are contained. Thus, since the frequency spectrum obtained in the case of the quiescent power supply current being normal differs from that for the case of the quiescent power supply current being abnormal, it is possible to give a decision on whether or not the quiescent power supply current is normal by deciding whether or not the power of the spectrum obtained by measurement conducted on the DUT as the object of testing falls within a range of normality (that is, whether or not the power of the spectrum obtained by the measurement exceeds the power at predetermined maximum values). For the power of the spectrum, the power of the fundamental wave, for example, may be used.

Figure 1:
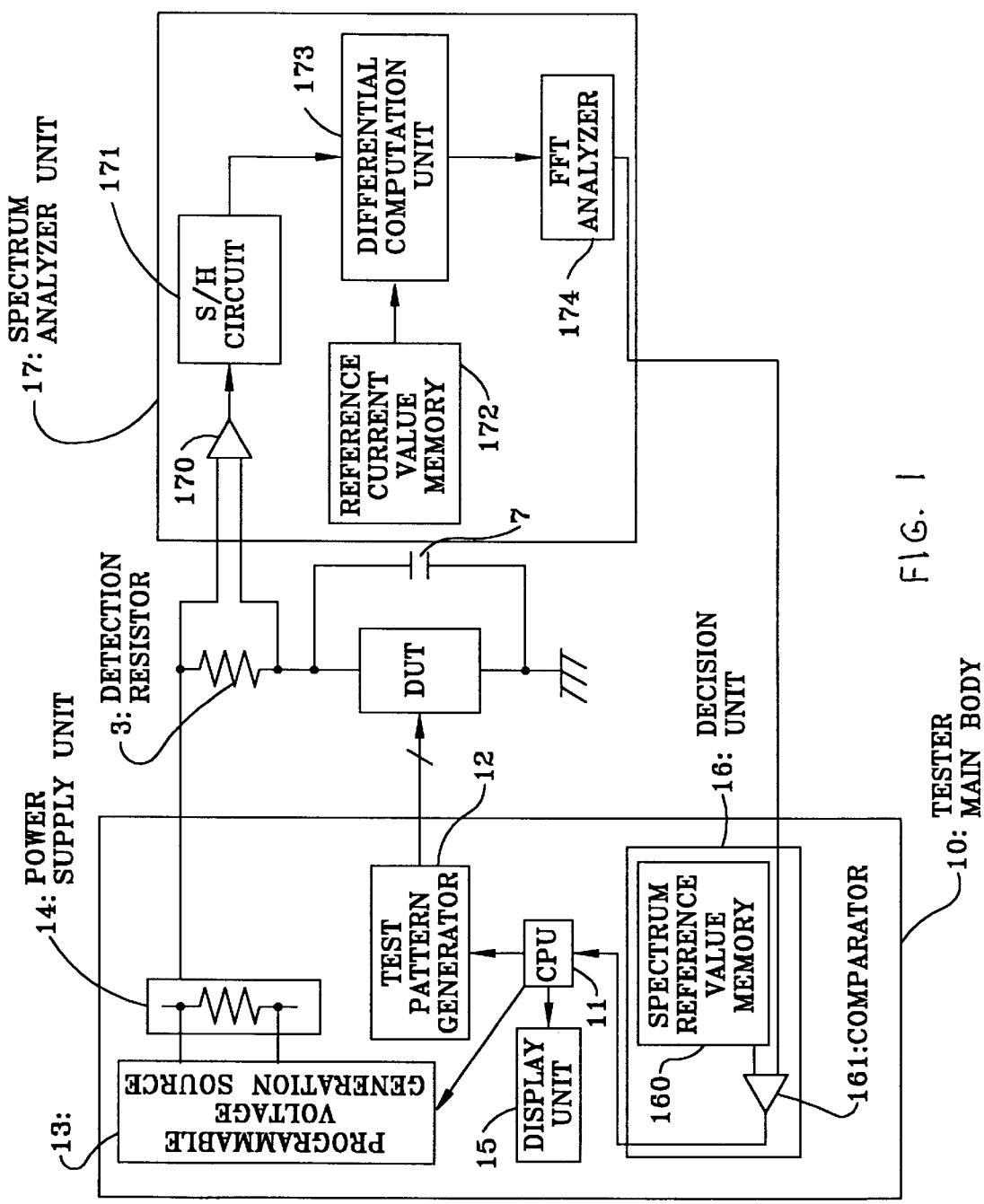
FIG. 1 is a block diagram showing the configuration of an embodiment of a device tester according to the invention.
Figure 5:
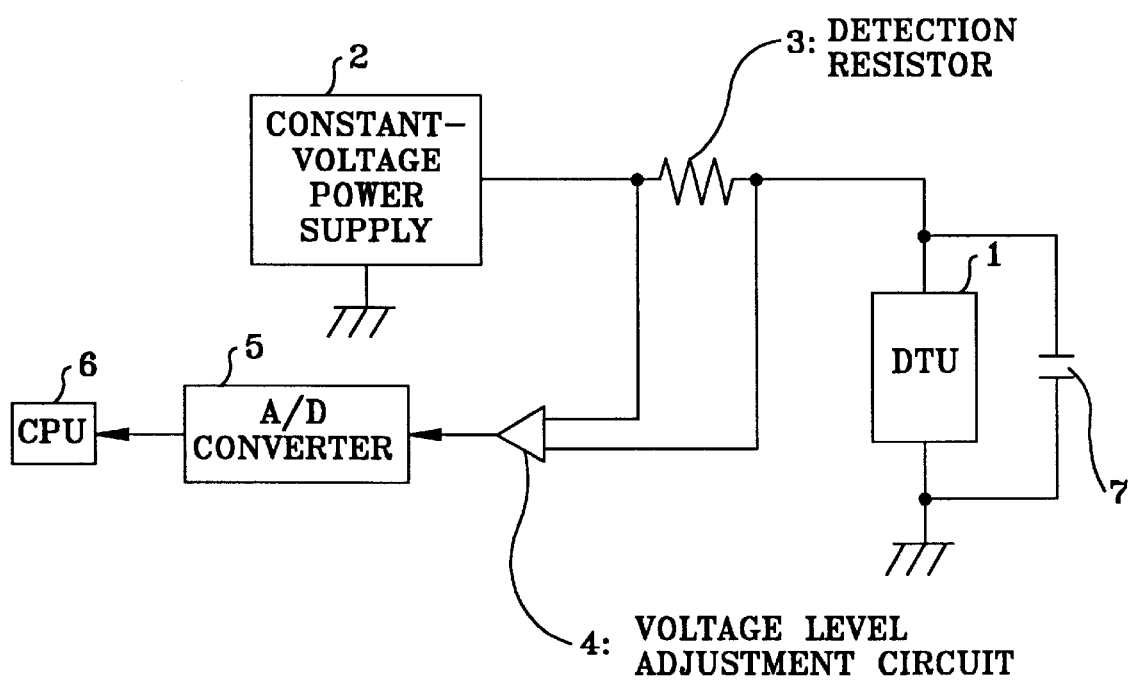
FIG. 5 is a block diagram showing the configuration of a conventional device tester.

Now FIG. 1 is a block diagram showing the configuration of this embodiment of a device tester according to the invention. In the figure, constituent elements corresponding to those in FIG. 5 are denoted by the same reference numerals, and description thereof is omitted. In FIG. 1, a tester main body 10 is a functional block installed inside the device tester, for conducting measurement on a DUT 1, and comprises a CPU 11, a test pattern generator 12, a programmable voltage generation source 13, a power supply unit 14, a display unit 15, and a decision unit 16.

The CPU 11 is to control operation of respective constituent elements within the tester main body 10, and the function thereof will be described in detail later. The test pattern generator 12 under control of the CPU 11 generates test patterns according to pattern information and test conditions, prestored internally, and applies the test patterns to the input terminal of the DUT 1. The programmable voltage generation source 13 controls the power supply unit 14, thereby applying a voltage at a voltage value as indicated by the CPU 11 to the power supply terminal of the DUT 1 via a detection resistor 3. The display unit 15 is to display results of a decision given on whether or not the quiescent power supply current is normal according to display data delivered from the CPU 11.

The decision unit 16 is made up of a spectrum reference value memory 160 and a comparator 161. The spectrum reference value memory 160 among these constituent elements prestores a spectrum reference value Po as the maximum value for the power of the fundamental wave of frequency spectra obtained from differentials between the power supply currents flowing through the reference and power supply currents flowing through the DUT 1. The comparator 161 compares a power Pf of the fundamental wave of the frequency spectrum delivered from a spectrum analyzer unit 17 with the spectrum reference value Po read out from the spectrum reference value memory 160, and sends out results of such comparison to the CPU 11. In this case, if the power Pf>the spectrum reference value Po, this means that an abnormal quiescent power supply current is present, and otherwise a normal quiescent power supply current is present.

Meanwhile, the spectrum analyzer unit 17 is connected to opposite ends of the detection resistor 3. In the spectrum analyzer unit 17, a current detection circuit 170 takes measurements of a voltage between the opposite ends of the detection resistor 3, thereby detecting a voltage value proportional to a current value of the power supply current flowing through the DUT 1. A S/H (sample/hold) circuit 171 performs sampling of the voltage values as detected by the current detection circuit 170, and quantizes the voltage values before outputting while holding quantized voltage values between samplings. A reference current value memory 172 prestores voltage values converted from the power supply current values obtained by applying the test patterns shown in FIG. 2 to the reference. The voltage values stored in the reference current value memory 172 represent data for one of the test patterns (that is, over the period of time T), and data for the respective voltage values, measured during periods corresponding to intervals between samplings performed by the S/H circuit 171, are stored. Further, in practice, measurements are taken on a plurality of references as the objects of testing, and through statistical analysis of a plurality of measured data obtained, data to be finally stored in the reference current value memory 172 are found.

A differential computation unit 173 reads out in sequence the voltages corresponding to the power supply current values of the reference from the reference current value memory 172, and at the same time, fetches the quantized voltage values sent out from the S/H circuit 171, thereby finding differentials between both the voltages in sequence. A FFT analyzer 174 applies the well known FFT (fast Fourier transformation) method to voltage value differentials sent out in sequence from the differential computation unit 173 to find a frequency spectrum thereof, and compute the power Pf of the fundamental wave of the frequency spectrum obtained, outputting same to the decision unit 16.

Figure 4:
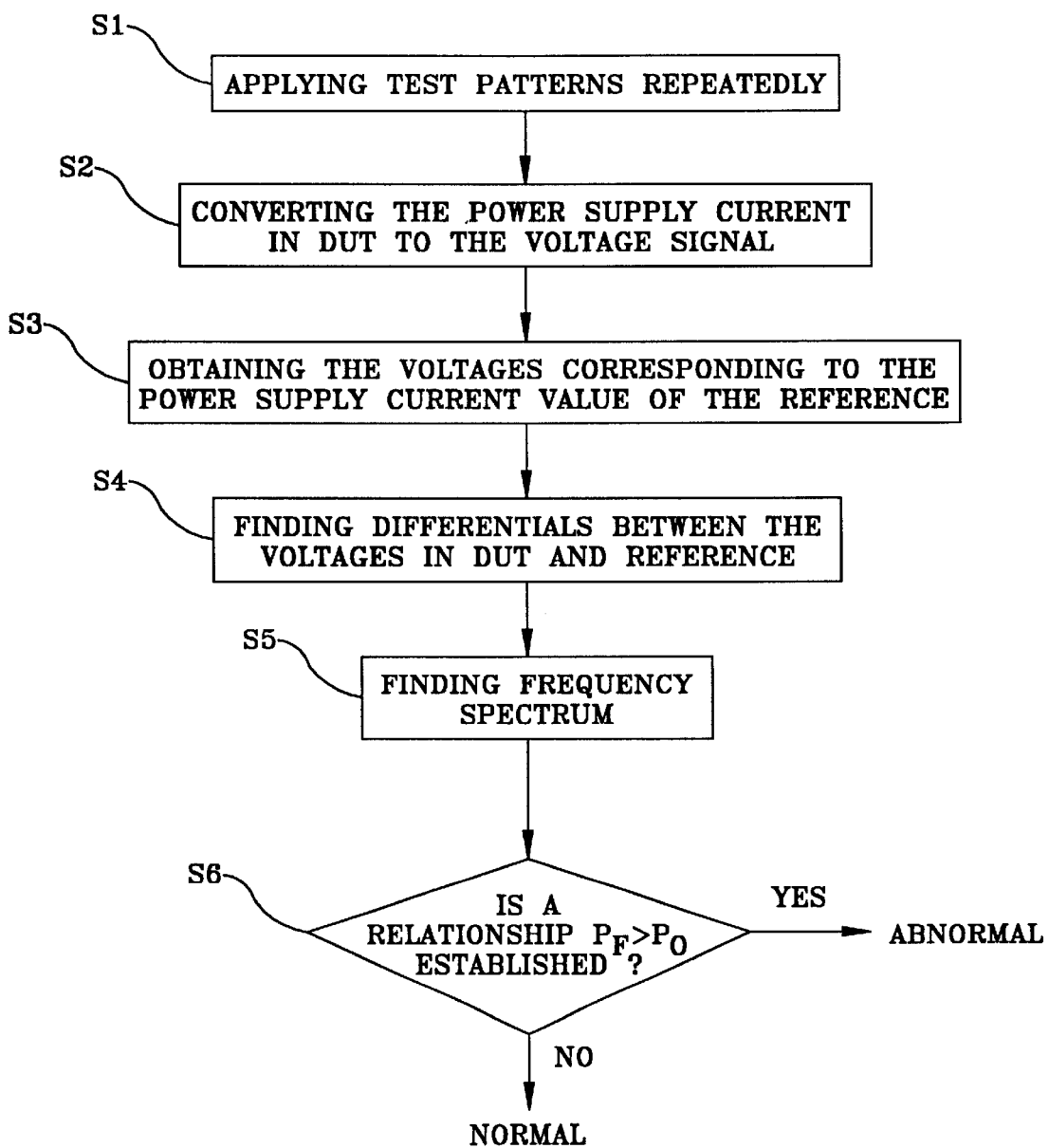
FIG. 4 is a flow chart showing broadly a procedure for detecting abnormal quiescent power supply current according to the embodiment of the invention.

Next, with reference to a flow chart shown in FIG. 4, a procedure is described hereinafter for deciding whether an abnormal quiescent power supply current is present or not by use of the tester of the configuration described above. First, the CPU 11 gives a direction to the test pattern generator 12 so as to generate the test patterns repeatedly and apply same to the DUT 1. This causes the same test patterns to be repeatedly applied to the DUT 1 for every period of time T as shown in FIG. 2 (step S1). Subsequently, the CPU 11 gives a direction to the programmable voltage generation source 13 so as to provide power supply, whereupon the programmable voltage generation source 13 causes the power supply unit 14 to generate a predetermined power supply voltage, which is then applied to the DUT 1 via the detection resistor 3. The power supply current Idd is caused to flow through the DUT 1 as a result of such power supply, and a voltage at voltage values proportional to the current values of the power supply current Idd is developed between the opposite ends of the detection resistor 3.

The current detection circuit 170 detects the voltage value occurring between the opposite ends of the detection resistor 3, and outputs same to the S/H circuit 171. The S/H circuit 171 fetches the voltage values delivered from the current detection circuit 170 at a predetermined cycle of sampling, and outputs quantized voltage values to the differential computation unit 173 (step S2). The differential computation unit 173 fetches the voltage values sent out from the S/H circuit 171 in sequence, and at the same time, also reads out in sequence the voltages corresponding to the power supply current values of the reference from the reference current value memory 172 (step S3), thereby finding differentials between both the voltages and sending out same to the FFT analyzer 174 in sequence (step S4).

The FFT analyzer 174 fetches the voltage value differentials sent out from the differential computation unit 173 in sequence, and at a time when sufficient number of the values to execute the FFT method are fetched, finds a frequency spectrum (step S5). Thereafter, the FFT analyzer 174 computes the power Pf of the fundamental wave of the frequency spectrum obtained, and outputs same to the comparator 161. The comparator 161 compares the power Pf with the spectrum reference value Po read out from the spectrum reference value memory 160, and outputs results of such comparison to the CPU 11.

In case of an abnormal quiescent power supply current flowing, a relationship of the power Pf>the spectrum reference value Po (the result of a decision in step S6 is "yes") is established, and otherwise (the result of a decision in step S6 is "no"), a decision is given that the quiescent power supply current is normal. The result of such a decision is displayed on the display unit 15 by the CPU 11. Subsequently, the CPU 11 gives a direction to the test pattern generator 12 to discontinue generation of the test patterns, thus completing the procedure for deciding whether the abnormal quiescent power supply current is present or not.

By applying the test patterns to the DUT repeatedly in such a way as described above a predetermined number of times as required to find the frequency spectrum, it is possible to decide whether or not the abnormal quiescent power supply current is present with respect to all of the test patterns. It means that time required to give a decision on abnormality of the quiescent power supply current amounts to just several microseconds in terms of one test pattern, so that testing time can be considerably shortened.

In the foregoing description, current values are once converted into voltage values before processing, however, it is evident that the current values may be directly measured. In such a case, the current values themselves instead of the voltage values converted from the current values are to be stored in the reference current value memory 172. Further, with this embodiment, the spectrum analyzer unit 17 is installed separately from the tester main body 10, however, may be incorporated in the tester main body 10. Furthermore, in the foregoing description, the fundamental wave contained in the frequency spectrum is in use for the power thereof, however, the harmonics of the frequency spectrum instead of the fundamental wave or a combination of the fundamental wave and the harmonics may alternatively be used.

As described hereinbefore, with the tester according to the invention, while applying test patterns repeatedly to a device under test, power supply current values thereof are measured, and a spectrum is found by executing a frequency analysis on a differential between the power supply current values and reference power supply current values of a device known to perform properly, measured beforehand, thereby deciding that the quiescent power supply current is abnormal in case the power of the spectrum is in excess of a predetermined threshold value. As a result, it is possible to decide whether or not an abnormal quiescent power supply current is present in about several microseconds in terms of one test pattern, so that efficiency in testing the device under test can be significantly improved, and in addition, it becomes practically possible to install the tester for the quiescent power supply current in the production line for devices.

What is claimed is:

1. A device tester for deciding whether or not an abnormal quiescent power supply current is present in a device under test by providing the device under test with power supply, said device tester comprising;

pattern generation means for applying test patterns repeatedly to the device under test;

measuring means for measuring current values of power supply current flowing through the device under test;

computation means for fading a differential between the current values of the power supply current as measured and reference power supply current values of a device known to perform properly, as measured beforehand by applying the test patterns thereto;

analyzing means for finding a spectrum by executing frequency analysis on the differential in power supply current value; and decision means for deciding presence of the abnormal quiescent power supply current by detecting that a power of the spectrum is in excess of a predetermined threshold value.

2. A device tester according to claim 1, wherein the predetermined threshold value is a maximum value permissible for the power of the spectrum obtained by executing the frequency analysis on the differential in power supply current value.

3. A device tester according to claim 1, wherein the reference power supply current value is determined through statistical analysis of power supply current values as measured of a plurality of devices of the same kind as the device under test and identified as performing properly.

4. A tester for deciding whether or not an abnormal quiescent power supply current is present in a device under test by providing the device under test with a power supply, said tester comprising:

a test pattern generator for applying test patterns repeatedly to the device under test;

a current detection circuit for measuring current values of power supply current flowing through the device under test;

a computation unit for finding a differential between the current values from the current detection circuit and reference power supply current values of a device known to perform properly, as measured beforehand by applying the test patterns thereto;

an analyzer for finding a spectrum by executing frequency analysis on the differential in current values; and a decision unit for deciding a presence of the abnormal quiescent power supply current by detecting that a power of the spectrum is in excess of a predetermined threshold value.

5. The tester according to claim 4, wherein the predetermined threshold value is a maximum value permissible for the power of the spectrum.

6. The tester according to claim 4, wherein the reference power supply current value is determined through statistical analysis of power supply current values as measured for a plurality of devices of the same kind as the device under test and identified as performing properly.

7. The tester according to claim 4, wherein the frequency analyses of the differential in current values comprises a fast Fourier transformation.

8. The tester according to claim 4, wherein said current detection circuit includes a detection resistor for converting the power supply current flowing through the device under test into the current values.

9. The tester according to claim 4, wherein said device under test comprises an integrated circuit.

10. A tester for deciding whether or not an abnormal quiescent power supply current is present in a device under test by providing the device under test with power supply, said tester comprising:

a test pattern generator for applying test patterns repeatedly to the device under test;

a programmable voltage supply generation source for providing a power supply current to the device under test;

a current detection circuit for measuring the power supply current flowing through the device under test, said current detection circuit including a detection resistor for converting the power supply current flowing through the device under test into the voltage values corresponding to the power supply current, and a sample hold circuit for storing the voltage values;

a computation unit for finding a differential between the voltage values from the current detection circuit and reference power supply values of a device known to perform properly, as measured beforehand by applying the test patterns thereto;

an analyzer for obtaining a spectrum by executing fast Fourier transformation on the differential;

a decision unit for deciding a presence of the abnormal quiescent power supply current by detecting that a power of the spectrum is in excess of a predetermined threshold value, said decision unit providing a decision output signal;

a processor unit for receiving said decision output signal, said processor unit controlling said test pattern generator and said programmable voltage supply generation source; and a display unit for displaying the presence of an abnormal quiescent power supply current for the device under test in response to said decision output signal.

11. The tester according to claim 10, wherein the spectrum from said analyzer includes a fundamental wave having a first frequency and harmonics of the first frequency.

12. A method for deciding whether or not an abnormal quiescent power supply current is present in a device under test, comprising the steps of:

applying supply power to the device under test;

applying test patterns repeatedly to the device under test;

detecting current values for power supply current flowing through the device under test;

computing a differential between the current values and stored reference power supply current values of a device known to perform properly;

analyzing the differential in the current value by frequency analyses to find a spectrum; and detecting that a power of the spectrum is greater than a predetermined threshold value to indicate the presence of an abnormal quiescent power supply current.

13. The method according to claim 12, wherein the stored reference power supply current value for the computing step is determined through statistical analysis of power supply current values as measured for a plurality of devices of the same kind as the device under test and identified as performing properly.

14. The method according to claim 12, wherein the frequency analyses step to find the spectrum comprises a fast Fourier transformation.

15. The method according to claim 12, including the step of displaying the presence of an abnormal quiescent power supply current for the device under test.

* * * * *